United States Patent
Choi et al.

(10) Patent No.: US 12,518,988 B2
(45) Date of Patent: Jan. 6, 2026

(54) SUBSTRATE PROCESSING SYSTEM AND SUBSTRATE PROCESSING METHOD USING THE SAME

(71) Applicant: Samsung Electronics Co., Ltd., Suwon-si (KR)

(72) Inventors: Jeonghee Choi, Suwon-si (KR); Bongcheol Kim, Suwon-si (KR); Hyungwan Do, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 218 days.

(21) Appl. No.: 18/325,200

(22) Filed: May 30, 2023

(65) Prior Publication Data

US 2024/0112933 A1    Apr. 4, 2024

(30) Foreign Application Priority Data

Sep. 30, 2022   (KR) .................. 10-2022-0125115

(51) Int. Cl.
| | | |
|---|---|---|
| *G03B 27/52* | (2006.01) | |
| *G03F 7/00* | (2006.01) | |

(Continued)

(52) U.S. Cl.
CPC ...... *H01L 21/67225* (2013.01); *G03F 7/2028* (2013.01); *G03F 7/30* (2013.01);
(Continued)

(58) Field of Classification Search
CPC ......... H01L 21/67225; H01L 21/67028; H01L 21/67069; H01L 21/67288;
(Continued)

(56) References Cited

U.S. PATENT DOCUMENTS

| | | | |
|---|---|---|---|
| 6,893,171 B2 * | 5/2005 | Fukutomi | ......... H01L 21/67276 414/935 |
| 8,031,324 B2 | 10/2011 | Fukutomi et al. | |

(Continued)

FOREIGN PATENT DOCUMENTS

| | | |
|---|---|---|
| JP | 1996069959 | 3/1996 |
| JP | 2912595 B2 | 2/1998 |

(Continued)

*Primary Examiner* — Mesfin T Asfaw
(74) *Attorney, Agent, or Firm* — Wolf, Greenfield & Sacks, P.C.

(57) ABSTRACT

A substrate processing system includes a coating apparatus configured to coat a photoresist film on a semiconductor substrate, an exposure apparatus configured to irradiate light onto the photoresist film to form a photoresist pattern region, a developing system configured to remove an unnecessary region from the photoresist film except for the photoresist pattern region to form a photoresist pattern, the developing system including a wet developing apparatus and a dry developing apparatus, the wet developing apparatus configured to remove the unnecessary region using a developing solution, the dry developing apparatus configured to remove the unnecessary region using a developing gas, a cleaning apparatus including a cleaning chamber and configured to remove an edge bead of the photoresist film or the photoresist pattern on an edge region of the semiconductor substrate, and a heating apparatus configured to heat the photoresist film or the photoresist pattern.

20 Claims, 3 Drawing Sheets

(51) Int. Cl.
*G03F 7/20* (2006.01)
*G03F 7/30* (2006.01)
*G03F 7/36* (2006.01)
*H01L 21/67* (2006.01)
*H01L 21/677* (2006.01)
*G03F 7/38* (2006.01)
*G03F 7/40* (2006.01)

(52) U.S. Cl.
CPC .............. *G03F 7/36* (2013.01); *G03F 7/7065* (2013.01); *H01L 21/67028* (2013.01); *H01L 21/67069* (2013.01); *H01L 21/67288* (2013.01); *H01L 21/67703* (2013.01); *G03F 7/38* (2013.01); *G03F 7/40* (2013.01)

(58) Field of Classification Search
CPC ......... H01L 21/67703; H01L 21/67011; H01L 21/6715; G03F 7/2028; G03F 7/30; G03F 7/36; G03F 7/7065; G03F 7/38; G03F 7/40; G03F 7/16; G03F 7/20; G03F 7/42; G03F 7/3021
See application file for complete search history.

(56) References Cited

U.S. PATENT DOCUMENTS

2008/0198341 A1* 8/2008 Fukutomi ......... H01L 21/67173 355/27
2022/0244645 A1 8/2022 Tan et al.

FOREIGN PATENT DOCUMENTS

| JP | 1998064865 | | 3/1998 |
| JP | 2000356857 | A | 12/2000 |
| KR | 19960000698 | | 1/1996 |
| KR | 20220025020 | A | 3/2022 |
| WO | 2022010809 | A1 | 1/2022 |
| WO | 2022103764 | A1 | 5/2022 |

* cited by examiner

SUBSTRATE PROCESSING SYSTEM AND SUBSTRATE PROCESSING METHOD USING THE SAME

PRIORITY STATEMENT

This application claims priority under 35 U.S.C. § 119 to Korean Patent Application No. 10-2022-0125115, filed on Sep. 30, 2022 in the Korean Intellectual Property Office (KIPO), the contents of which are herein incorporated by reference in their entirety.

FIELD

Example embodiments relate to a substrate processing system and a substrate processing method using the same. More particularly, example embodiments relate to a substrate processing system for performing a photolithography process on a semiconductor substrate and a substrate processing method using the same.

BACKGROUND

In a photolithography process, at least a portion of a photoresist film formed on a semiconductor substrate may be removed by a developing process to form a photoresist pattern. A dry developing process using a developing gas may be used to improve a collapse margin of the photoresist pattern. Since the dry developing process requires additional equipment compared to wet developing process equipment, the process equipment becomes complicated and the process time is increased, which may cause critical dimension defects on the photoresist pattern.

SUMMARY

Example embodiments provide a substrate processing system capable of selectively performing a dry developing process and a wet developing process in one process facility.

Example embodiments provide a substrate processing method using the substrate processing system.

According to example embodiments, a substrate processing system includes a coating apparatus configured to coat a photoresist film on a semiconductor substrate, an exposure apparatus configured to irradiate light onto the photoresist film to form a photoresist pattern region, a developing system configured to remove an unnecessary region from the photoresist film except for the photoresist pattern region to form a photoresist pattern, the developing system including a wet developing apparatus and a dry developing apparatus, the wet developing apparatus configured to remove the unnecessary region using a developing solution, the dry developing apparatus configured to remove the unnecessary region using a developing gas, a cleaning apparatus including a cleaning chamber and configured to remove an edge bead of the photoresist film or the photoresist pattern on an edge region of the semiconductor substrate, and a heating apparatus configured to heat the photoresist film or the photoresist pattern.

According to example embodiments, a substrate processing system includes track equipment configured to apply a photoresist film on a semiconductor substrate, the track equipment configured to form a photoresist pattern from the photoresist film, and an exposure apparatus configured to irradiate light onto the photoresist film to form a photoresist pattern region. The track equipment includes a coating apparatus configured to coat the photoresist film on the semiconductor substrate, a developing system configured to remove an unnecessary region from the photoresist film except for the photoresist pattern region to form a photoresist pattern, the developing system including a wet developing apparatus and a dry developing apparatus, the wet developing apparatus configured to remove the unnecessary region using a developing solution, the dry developing apparatus configured to remove the unnecessary region using a developing gas, a cleaning apparatus including a cleaning chamber and configured to remove an edge bead of the photoresist film or the photoresist pattern on an edge region of the semiconductor substrate, and a heating apparatus configured to heat the photoresist film or the photoresist pattern.

According to example embodiments, a substrate processing system includes track equipment configured to apply a photoresist film on a semiconductor substrate, the track equipment configured to form a photoresist pattern from the photoresist film, and an exposure apparatus configured to irradiate light onto the photoresist film to form a photoresist pattern region. The track equipment includes a coating apparatus configured to apply the photoresist film on the semiconductor substrate, a developing system configured to remove an unnecessary region from the photoresist film except for the photoresist pattern region to form a photoresist pattern, the developing system including a wet developing apparatus and an adjacent dry developing apparatus, the wet developing apparatus configured to remove the unnecessary region with a developing solution, the dry developing apparatus configured to remove the unnecessary region with a developing gas, the developing system configured to select any one of the wet developing apparatus and the dry developing apparatus as a developing device to form the photoresist pattern, a cleaning apparatus including a single cleaning chamber that provides a space for (i) cleaning the semiconductor substrate with a cleaning gas and (ii) removing an edge bead of the photoresist film or the photoresist pattern on an edge region of the semiconductor substrate, a heating apparatus configured to heat the photoresist film or the photoresist pattern, a development inspection apparatus configured to inspect a quality of the photoresist pattern formed on the semiconductor substrate, and a transfer device configured to transfer the semiconductor substrate among the coating apparatus, the wet developing apparatus, the dry developing apparatus, the cleaning apparatus, and the heating apparatus.

According to example embodiments, a substrate processing system may include a coating apparatus configured to apply a photoresist film on a semiconductor substrate, an exposure apparatus configured to irradiate light onto the photoresist film to form a photoresist pattern region, a developing system configured to remove an unnecessary region from the photoresist film except for the photoresist pattern region to form a photoresist pattern, the developing portion including a wet developing apparatus and a dry developing apparatus, the wet developing apparatus configured to remove the unnecessary region through a developing solution, the dry developing apparatus configured to remove the unnecessary region through a developing gas, a cleaning apparatus having a cleaning chamber that provides a space for removing an edge bead of the photoresist film or the photoresist pattern on an edge region of the semiconductor substrate, and a heating apparatus configured to heat the photoresist film or the photoresist pattern.

Thus, the substrate processing system may include the developing system, the exposure apparatus, and the heating apparatus in one process facility. The developing system may perform a developing process, the exposure apparatus may perform an exposure process, and the heating apparatus may perform a soft bake process, a pre-exposure bake (PEB) process, a hard bake process, and the like. The substrate processing system may have the wet developing apparatus and the dry developing apparatus in the one process facility. A wet developing process and a dry developing process may be selectively performed according to a type of the semiconductor substrate.

Accordingly, the substrate processing system may minimize a delay affecting dispersion between the processes by using the one process facility. Since the wet developing apparatus and the dry developing apparatus are provided in the one process facility, the substrate processing system may use the cleaning apparatus and the heating apparatus in the dry developing process. Since no additional equipment is required to perform the dry developing process, equipment costs may be reduced. In addition, since the substrate processing system uses the one process facility, it is possible to reduce turn around time (TAT) for manufacturing the semiconductor substrate.

BRIEF DESCRIPTION OF THE DRAWINGS

Example embodiments will be more clearly understood from the following detailed description taken in conjunction with the accompanying drawings.

FIG. 1 is a block diagram illustrating a substrate processing system in accordance with example embodiments.

FIG. 2 is a cross-sectional view illustrating a wet developing apparatus in FIG. 1.

FIG. 3 is a cross-sectional view illustrating a dry developing apparatus in FIG. 1.

FIG. 4 is a flowchart illustrating a substrate processing method in accordance with example embodiments.

DETAILED DESCRIPTION

Hereinafter, example embodiments will be explained in detail with reference to the accompanying drawings.

Figure 1:
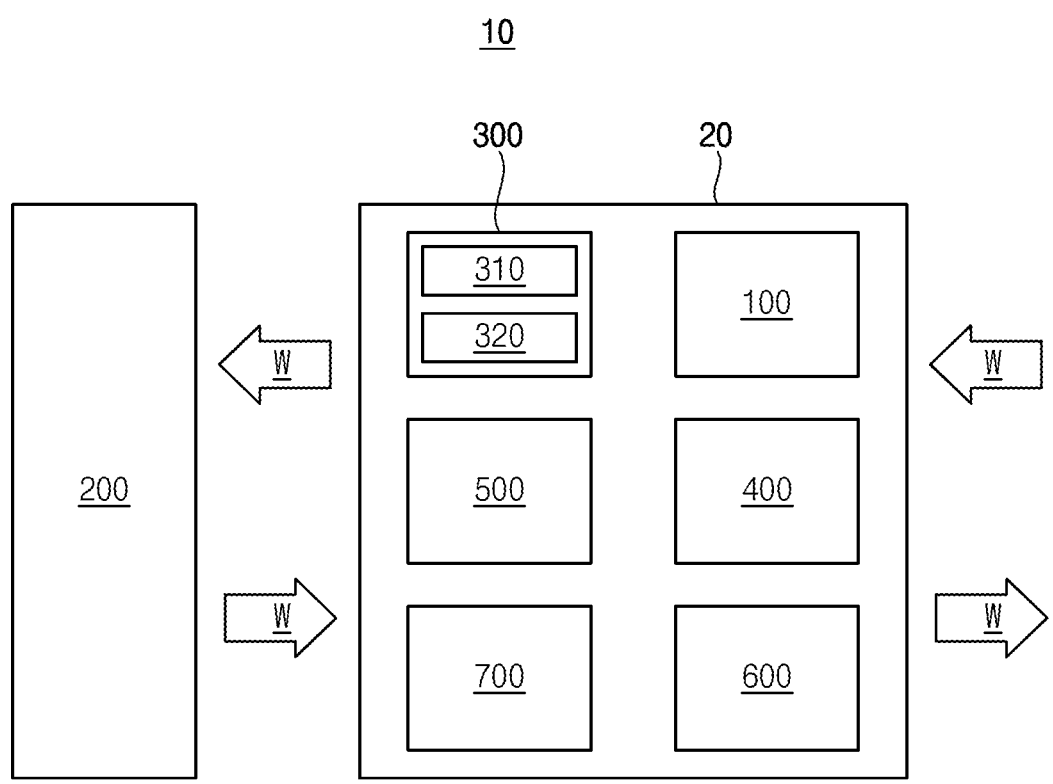
FIGS. 1 to 4 represent non-limiting, example embodiments as described herein.
Figure 2:
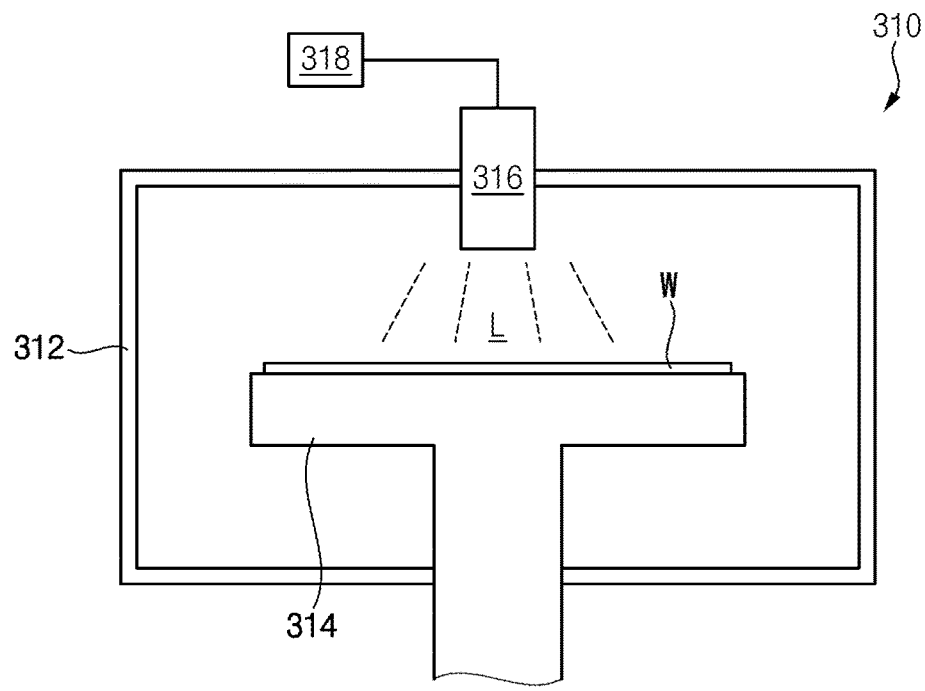
Figure 3:
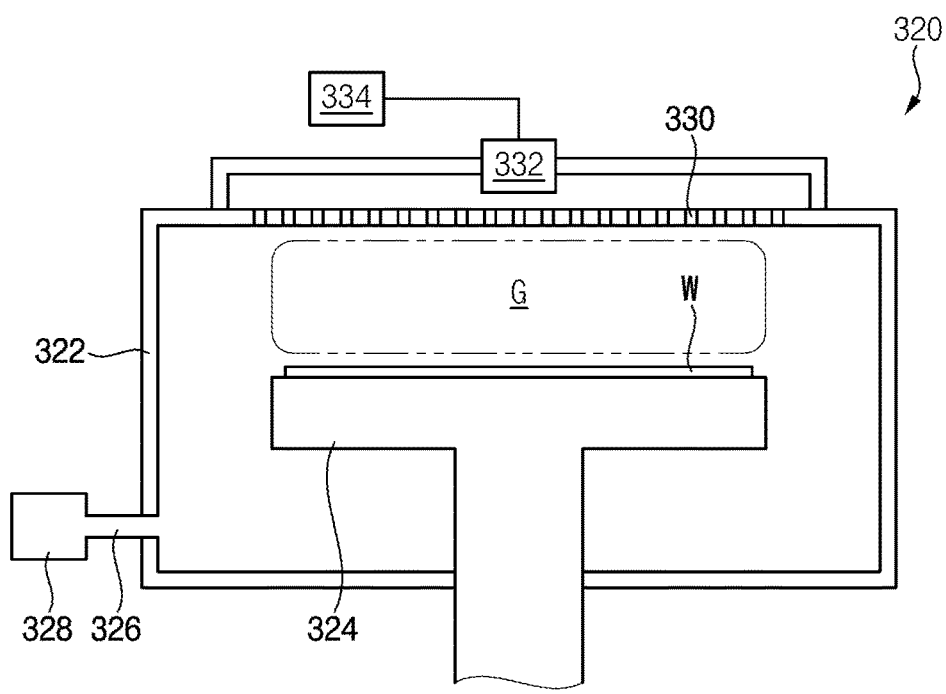

FIG. 1 is a block diagram illustrating a substrate processing system in accordance with example embodiments. FIG. 2 is a cross-sectional view illustrating a wet developing apparatus in FIG. 1. FIG. 3 is a cross-sectional view illustrating a dry developing apparatus in FIG. 1.

Referring to FIGS. 1 to 3, a substrate processing system 10 may include track equipment 20 configured to form a photoresist film and form a photoresist pattern from the photoresist film, and an exposure apparatus configured to irradiate light onto the photoresist film to form a photoresist pattern region. The substrate processing system 10 may be referred to as a system that performs a lithography process of transitioning circuit patterns using light on a semiconductor substrate.

In example embodiments, the track equipment 20 may form the photoresist film on a substrate such as a semiconductor wafer. The track equipment 20 may form the photoresist pattern from the photoresist film provided on the substrate. For example, the substrate may include a silicon wafer on which features having irregular surface topography are formed on an upper surface. For example, the track equipment 20 may include a spinner apparatus.

The track equipment 20 may include a coating apparatus 100 configured to form the photoresist film on the substrate, a developing portion or developing system 300 configured to form the photoresist pattern from the photoresist pattern region, a cleaning apparatus 400 configured to remove and clean a portion of the photoresist film or the photoresist pattern, and a heating apparatus 500 configured to bake the photoresist film or the photoresist pattern. The track equipment 20 may further include a transfer device 600 configured to transport the substrate in the equipment, and a development inspection portion or development inspection apparatus or system 700 configured to inspect the photoresist film formed on the substrate.

In example embodiments, the exposure apparatus may irradiate the light onto the photoresist film formed on the substrate to form the photoresist pattern region. The photoresist pattern region may be required to form the photoresist pattern. The exposure apparatus may align a mask on the substrate and irradiate the light onto the mask to form the photoresist pattern region.

In example embodiments, the coating apparatus 100 may coat the photoresist film on the substrate. For example, the photoresist film may include a positive developing material in which a portion irradiated with light dissolves, and a negative developing material in which a portion not irradiated with light dissolves. The photoresist film may be deposited on the substrate and used as a resist for the lithography process.

The photoresist film may include a photosensitive material that reacts to extreme ultraviolet (EUV) such as EUV light. The photosensitive material may include a sensitive metal or metal oxide. For example, the photosensitive material may include tin (Sn), hafnium (Hf), tellurium (Te), bismuth (Bi), indium (In), antimony (Sb), iodine (I), and germanium (Ge).

The coating apparatus 100 may coat the photosensitive material on the substrate through a deposition process in a deposition chamber. The deposition process may include a wet deposition process such as a spin-on process, a dry deposition process (CVD, chemical vapor deposition), and the like. For example, in the dry deposition process, a pressure in the deposition chamber may be within a range of 10 mTorr to 10 Torr, and a temperature in the deposition chamber may be within a range of 0 degrees to 250 degrees Celsius.

In example embodiments, the exposure apparatus may include an exposure portion or exposure apparatus 200. The exposure portion 200 may irradiate the light onto the photoresist film to form the photoresist pattern region. The photoresist pattern region may be a region where a photoresist reaction occurs by irradiating the light onto the photoresist film. The exposure apparatus may receive the substrate from the track equipment 20, perform an exposure process, and transfer the substrate to the track equipment 20.

The exposure portion 200 may align the mask having the photoresist pattern region on the photoresist film formed on the substrate. The exposure portion 200 may expose the extreme ultraviolet to the photoresist film on which the mask is aligned. The extreme ultraviolet may be irradiated to the photoresist film to cause a change in chemical composition and cross link in the photoresist film. The extreme ultraviolet may form a contrast with etching selectivity on the photoresist film.

In example embodiments, the developing portion 300 may remove unnecessary regions other than the photoresist pattern region from the photoresist film by a developing process to form the photoresist pattern. For example, the developing process may include a dry developing process and a wet developing process.

The developing portion 300 may develop the photoresist pattern region such that the photoresist film on the substrate forms the photoresist pattern. For example, the developing process may include positive development and negative development. In the positive development, a portion irradiated with the light may be dissolved to form the photoresist pattern. In the negative development, a portion not irradiated with the light may be dissolved to form the photoresist pattern.

The developing portion 300 may remove the unnecessary region through a developing apparatus. The developing apparatus may include a wet developing apparatus 310 that removes the unnecessary region through or using a developing solution or developer L, and a dry developing apparatus 320 that removes the unnecessary region through or using a developing gas G.

The photoresist film may be developed by exposure to a developing chemical. The developing chemical may include the developing solution L and the developing gas G. The development chemical may include hydrogen and halides. The development chemicals may include hydrogen halides and hydrogen and halogen gases.

The wet developing apparatus 310 may perform the wet developing process, and the dry developing apparatus 320 may perform the dry developing process. For example, the wet developing apparatus 310 may be combined to or with the deposition chamber that performs the wet deposition process, and the dry developing apparatus 320 may be combined to or with the deposition chamber that performs the dry deposition process. The wet developing process may be combined with the wet deposition process, and the dry developing process may be combined with the dry deposition process.

The wet developing apparatus 310 and the dry developing apparatus 320 may be provided in the one track equipment 20. The developing portion 300 or a controller associated therewith may select the developing device from the wet developing apparatus 310 or the dry developing apparatus 320 to form the photoresist pattern according to a type of the substrate. Alternatively, the developing portion 300 may perform the wet developing process and the dry developing process on the one substrate.

In example embodiments, the wet developing apparatus 310 may include a wet developing chamber 312, a first substrate stage 314, a nozzle 316 and a liquid supply source 318. The wet developing apparatus 310 may place the substrate W on the first substrate stage 314, and may apply the developer L provided from a nozzle onto the substrate W. At least a portion of the photoresist film on the substrate W may be dissolved by the developer L to from the photoresist pattern.

The wet developing process may be performed in the wet developing apparatus 310. The wet developing apparatus 310 may include the wet developing chamber 312, the first substrate stage 314 on which the substrate W is arranged, the nozzle 316 and the liquid supply source 318. The wet developing process may be performed by directly applying the developer L on the photoresist film.

The wet developing chamber 312 may provide a space for performing the wet developing process on the substrate W. The first substrate stage 314 supporting the substrate may be provided in the wet developing chamber 312. When the developer L is supplied on the photoresist film of the substrate W, the first substrate stage 314 may rotate clockwise or counterclockwise to apply the developer L on the photoresist film.

The nozzle 316 may be provided on or above the first substrate stage 314 to apply liquid on the substrate W. The nozzle 316 may directly supply the liquid onto the substrate W. The liquid may include the developing solution for performing the wet developing process. For example, the developer may include tetramethylammonium hydroxide (TMAH).

A gate may be provided on a sidewall of the wet developing chamber 312 to allow the wafer W to enter and exit. The wafer W may be loaded and unloaded onto and from the first substrate stage 314 through the gate.

In example embodiments, the dry developing process may be performed in the dry developing apparatus 320. The dry developing apparatus 320 may include a dry developing chamber 322, a second substrate stage 324 on which the substrate W is arranged, an exhaust port 326, an exhaust portion or exhaust apparatus 328, and a gas supply portion or gas supply system. The developing chemical may be transferred onto the photoresist film in a vapor phase to perform the dry developing process. For example, plasma or heat may be supplied into hydrogen halogen gas to perform the developing process.

The dry developing process may provide more tunability. The dry developing process may provide additional Critical Dimension (CD) control and scum removal. The dry developing process may not be limited by solubility and cluster size. The dry developing process may reduce a possibility of occurrence of pattern collapse or peeling of the photoresist pattern. The dry developing process may protect the photoresist pattern from contaminants in air through the developing gas G.

The dry developing chamber 322 may provide an enclosed space for performing the dry developing process on the substrate W. The dry developing chamber 322 may be a cylindrical vacuum chamber. The dry developing chamber 322 may include or be formed of a metal such as aluminum or stainless steel.

The second substrate stage 324 supporting the substrate may be provided in the dry developing chamber 322. For example, the second substrate stage 324 may serve as a susceptor for supporting the substrate. The second substrate stage 324 may include an electrostatic chuck for holding the wafer W with an electrostatic adsorption force. The electrostatic chuck may adsorb and hold the wafer W with electrostatic power by a direct current voltage that is supplied from a direct current power source.

The gas supply portion may include gas supply pipes 330, a flow controller 332, and a gas supply source 334 as gas supply elements. The gas supply pipes 330 may supply various gases to the top and/or side of the dry developing chamber 322. The gas supply pipes 330 may directly supply various gases into the dry developing chamber 322.

The gas may include the developing gas G for performing the dry developing process. For example, the developing gas may include hydrogen ($H_2$), chlorine ($Cl_2$), fluorine ($F_2$), bromine ($Br_2$), iodine ($I_2$), hydrogen chloride (HCl), hydrogen fluoride (HF), hydrogen bromide (HBr), and hydrogen iodide (HI).

The gas supply portion may supply different gases at a desired ratio. The gas supply source 334 may store a plurality of gases, and the gases may be supplied through a plurality of gas lines respectively connected to the gas supply pipes 330. The flow controller 332 may control supply flow rates of the gases that are introduced into the dry developing chamber 322 through the gas supply pipes 330. The flow controller 332 may independently or commonly control the supply flow rates of the gases that are supplied to the gas supply pipes 330. For example, the gas supply source 334 may include a plurality of gas tanks, and the flow controller 332 may include a plurality of mass flow controllers (MFCs) that respectively correspond to the gas tanks. The mass flow controllers may independently control the supply flow rates of the gases.

A gate may be installed on a sidewall of the dry developing chamber 322 to allow the wafer W to enter and exit. The wafer W may be loaded and unloaded onto and from the second substrate stage 324 through the gate.

The exhaust port 326 may be installed at a bottom of the dry developing chamber 322, and the exhaust portion 328 may be connected to the exhaust port 326 through an exhaust pipe. The exhaust portion 328 may include a vacuum pump such as a turbo molecular pump to adjust a processing space inside the dry developing chamber 322 to a desired vacuum level. In addition, process byproducts and residual process gases that are generated in the dry developing chamber 322 may be discharged through the exhaust port 326.

In example embodiments, the cleaning apparatus 400 may clean the substrate W within a cleaning chamber. The cleaning apparatus 400 may perform a cleaning process to clean a rear surface or edge region of the substrate W. The cleaning apparatus 400 may remove foreign substances that are generated during a process.

The cleaning process may non-selectively etch the photoresist film or the photoresist pattern to uniformly remove a film that has various levels of oxidation or the cross link on the rear surface or the edge region. For example, the cleaning process may include an edge bead removal (EBR) process.

The cleaning apparatus 400 may remove an edge bead of the photoresist film on the edge region of the substrate W. The cleaning apparatus 400 may remove the edge bead of the photoresist pattern on the edge region of the substrate W.

The cleaning apparatus 400 may remove a first edge bead of the photoresist film and a second edge bead of the photoresist pattern in the same cleaning chamber. The cleaning apparatus 400 may remove the first edge bead of the photoresist film before the exposure process is performed through the cleaning chamber, and the cleaning apparatus 400 may remove the second edge bead of the photoresist pattern after the developing process is performed.

The cleaning apparatus 400 may clean the substrate through a cleaning gas in the cleaning chamber. The cleaning apparatus 400 may clean the substrate regardless of process progress. For example, the cleaning gas may include hydrogen bromide (HBr), hydrogen chloride (HCl), boron trichloride ($BCl_3$), thionyl chloride ($SOCl_2$), chlorine ($Cl_2$), boron tribromide ($BBr_3$), hydrogen ($H_2$), oxygen ($O_2$), phosphorus trichloride ($PCl_3$), methane ($CH_4$), methanol ($CH_3OH$), ammonia ($NH_3$), formic acid ($CH_2O_2$), nitrogen trifluoride ($NF_3$), and hydrogen fluoride (HF).

In example embodiments, the heating apparatus 500 may heat the photoresist film or the photoresist pattern. The heating apparatus 500 may heat the photoresist film or the photoresist pattern that are formed on the substrate W through a bake process in a heating chamber. The heating apparatus 500 may heat the photoresist film and the photoresist pattern in the same heating chamber. For example, the bake process may include a soft bake process, a pre-exposure bake (PEB) process, a post dry develop bake (PDDB) process, and a hard bake process.

The heating apparatus 500 may heat the photoresist film provided on the substrate to a first temperature. The heating apparatus 500 may heat the photoresist pattern region provided on the substrate to a second temperature that is different from the first temperature. The heating apparatus 500 may heat the photoresist pattern provided on the substrate to a third temperature that is different from the first and second temperatures.

The heating apparatus 500 may heat the photoresist film that is formed by a coating process to the first temperature. The heating apparatus 500 may remove an organic solvent in the photoresist film. The heating apparatus 500 may further increase the contrast of the etching selectivity by heating the photoresist film. For example, the first temperature may be within a range of 90 degrees to 110 degrees Celsius.

The heating apparatus 500 may heat the photoresist film that has the photoresist pattern region to the second temperature. The photoresist pattern region may be formed by the exposure process. The heating apparatus 500 may improve a non-uniform pattern by diffusing acid in the photoresist pattern region to which the light is irradiated. For example, the second temperature may be within a range of 110 degrees to 120 degrees Celsius.

The heating apparatus 500 may heat the photoresist pattern formed by the developing process to the third temperature. The heating apparatus 500 may improve adhesion between the substrate and the photoresist pattern. The heating apparatus 500 may improve durability and etch resistance of the photoresist pattern. The heating apparatus 500 may remove residual solvent in the photoresist pattern. For example, the third temperature may be within a range of 110 degrees to 130 degrees Celsius.

The heating apparatus 500 may inject a reactive gas into the heating chamber when the bake process is in progress. For example, the reactive gas may include air, water ($H_2O$), hydrogen peroxide ($H_2O_2$), carbon dioxide ($CO_2$), carbon monoxide (CO), oxygen ($O_2$), ozone ($O_3$), methane ($CH_4$), methanol ($CH_3OH$), nitrogen ($N_2$), hydrogen ($H_2$), ammonia ($NH_3$), nitrogen dioxide ($N_2O$), nitrogen monoxide (NO), argon (Ar), and helium (He).

In example embodiments, the transfer device 600 may receive the substrate into the track equipment 20, and the transfer device 600 may transfer the substrate out of the track equipment 20. The transfer device 600 may transfer the substrate from the track equipment 20 to the exposure apparatus, and the transfer device 600 may receive the substrate from the exposure apparatus to the track equipment 20.

The transfer device 600 may include a load station that receives the substrate, a wafer transfer system that delivers the substrate within the track equipment 20, and a transfer station that transfers the substrate. The transfer device 600 may deliver the substrate between the coating apparatus 100, the exposure portion 200, the developing portion 300, the cleaning apparatus 400, the heating apparatus 500, and the development inspection portion 700. The transfer device 600 may place the substrate on a substrate support portion in a chamber in which a process is performed.

In example embodiments, the development inspection portion 700 may inspect a quality of the photoresist pattern that is formed on the semiconductor substrate. The development inspection portion 700 may inspect the quality of the photoresist pattern in an inspection chamber.

The photoresist pattern formed through the developing process may have a defective structure. The development inspection portion 700 may generate a warning signal or the like when the defective structure is found in the photoresist pattern. When the defective structure is not found in the photoresist pattern, the development inspection portion 700 may proceed with a next process. For example, the defective structure may be formed through under develop, incomplete develop, or severe overdevelop.

As described above, the substrate processing system 10 may include the developing portion 300 that performs the developing process, the exposure portion 200 that performs the exposure process, and the heating apparatus 500 that performs the bake process in one process facility. The substrate processing system 10 may have the wet developing apparatus 310 and the dry developing apparatus 320 in the one process facility. A wet developing process and a dry developing process may be selectively performed according to the type of the semiconductor substrate.

Accordingly, the substrate processing system 10 may minimize a delay affecting dispersion between the processes by using the one process facility. Since the wet developing apparatus 310 and the dry developing apparatus 320 are provided in the one process facility, the substrate processing system 10 may use the cleaning apparatus 400 and the heating apparatus 500 in the dry developing process. Since no additional equipment is required to perform the dry developing process, equipment costs may be reduced. In addition, since the substrate processing system 10 uses the one process facility, it is possible to reduce turn around time (TAT) for manufacturing the semiconductor substrate.

Hereinafter, a substrate processing method of using the substrate processing system in FIG. 1 will be described.

Figure 4:
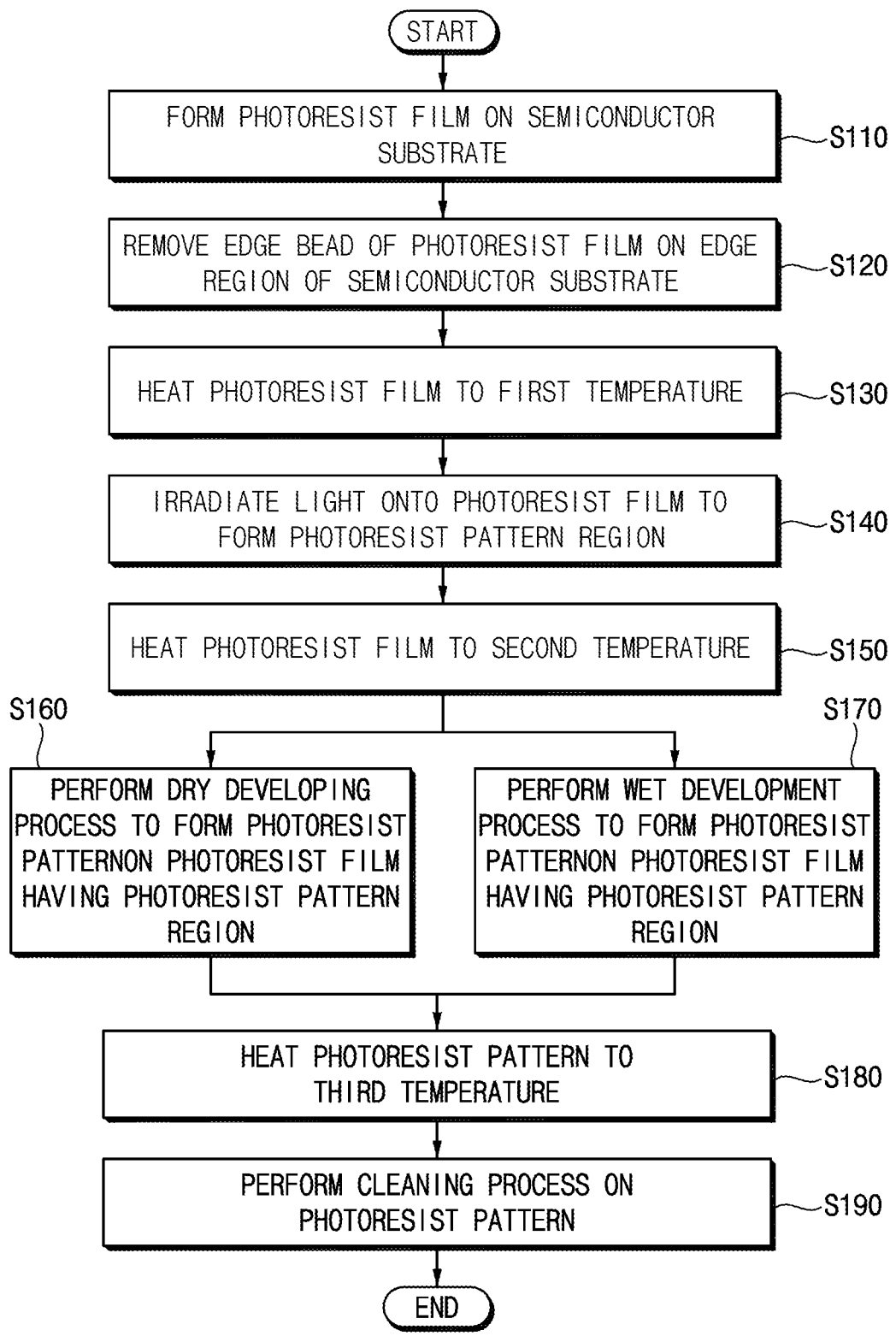

FIG. 4 is a flowchart illustrating a substrate processing method in accordance with example embodiments.

Referring to FIGS. 1 to 4, first, a photoresist film may be formed on a semiconductor substrate W (S110).

In example embodiments, the photoresist film having a photosensitive material may be coated on the substrate by a deposition process in a deposition chamber. The deposition process may include a wet deposition process such as a spin-on process, a dry deposition process (CVD, chemical vapor deposition), and the like.

The photoresist film may include the photosensitive material that reacts to extreme ultraviolet (EUV) such as EUV light. The photosensitive material may include a sensitive metal or metal oxide. For example, the photosensitive material may include tin (Sn), hafnium (Hf), tellurium (Te), bismuth (Bi), indium (In), antimony (Sb), iodine (I), and germanium (Ge).

Then, an edge bead of the photoresist film may be removed from an edge region of the semiconductor substrate (S120), and the photoresist film may be heated to a first temperature (S130).

In example embodiments, the edge bead of the photoresist film may be removed by a cleaning process. The cleaning process may be performed in a cleaning chamber. The edge bead may be removed from the photoresist film to prevent defects in the semiconductor substrate. For example, the cleaning process may include an edge bead removal (EBR) process.

In example embodiments, the photoresist film that is formed by the coating process may be heated by a bake process. The bake process may be performed in a heating chamber. The photoresist film may be heated to the first temperature. The bake process of heating to the first temperature may include a soft bake process.

An organic solvent in the photoresist film may be removed by the soft bake process. A contrast of an etching selectivity in the photoresist film may be further increased by the soft bake process. For example, the first temperature may be within a range of 90 degrees to 110 degrees Celsius.

Then, light may be irradiated on the photoresist film to form a photoresist pattern region (S140), and the photoresist film may be heated to a second temperature (S150).

In example embodiments, the light may be irradiated onto the photoresist film to form the photoresist pattern region. The photoresist pattern region may be performed by an exposure process. The photoresist pattern region may be referred to a region where a photoresist reaction occurs. The photoresist reaction may occur when the light is irradiated onto the photoresist film.

A mask having the photoresist pattern region may be aligned on the photoresist film that is formed on the substrate. At least a portion of the photoresist film on which the mask is aligned may expose to the extreme ultraviolet. A change in chemical composition and in cross link may occur in the at least portion of the photoresist film that is irradiated with the extreme ultraviolet.

In example embodiments, the photoresist film having the photoresist pattern region that is formed by the exposure process may be heated by the bake process. The photoresist film may be heated to a second temperature. The bake process of heating to the second temperature may include a pre-exposure bake (PEB) process. The pre-exposure bake process may be performed in the same heating chamber as the soft bake process.

In the pre-exposure bake process, a non-uniform pattern may be improved by diffusing acid in the photoresist pattern region to which the light is irradiated. For example, the second temperature may be within a range of 110 degrees to 120 degrees Celsius.

Then, a dry developing process may be performed on the photoresist film that has the photoresist pattern region to form a photoresist pattern (S160), and/or a wet developing process may be performed to form the photoresist pattern (S170).

In example embodiments, unnecessary regions other than the photoresist pattern region may be removed from the photoresist film by a developing process to form the photoresist pattern. For example, the developing process may include a dry developing process and a wet developing process. The developing process may include positive development and negative development.

The developing process may be selectively performed through the wet developing apparatus 310 and the dry developing apparatus 320. The wet developing apparatus 310 may perform the wet developing process, and the dry developing apparatus 320 may perform the dry developing process.

For example, the wet developing apparatus 310 may be combined to or with the deposition chamber in which the wet deposition process is performed, and the dry developing apparatus 320 may be combined to or with the deposition chamber in which the dry deposition process is performed. The wet development process may be combined with the wet deposition process, and the dry developing process may be combined with the dry deposition process.

The wet developing apparatus 310 and the dry developing apparatus 320 may be provided in one track equipment 20. The developing apparatus that forms the photoresist pattern may be selected from the wet developing apparatus 310 or the dry developing apparatus 320 according to a type of the substrate. Alternatively, the wet developing process and the dry developing process may be performed on one substrate.

Since the dry developing apparatus 320 is provided in the track equipment 20 together with the wet developing apparatus 310, a delay affecting dispersion between the processes may be minimized.

Since the wet developing apparatus 310 and the dry developing apparatus 320 are provided in one process facility, the semiconductor substrate that is subjected to the dry developing process in the dry developing apparatus 320 may be quickly transferred to a process device that performs a subsequent process, and manufacturing time (TAT, Turn Around Time) may be reduced.

Then, the photoresist pattern may be heated to a third temperature (S180), and a cleaning process may be performed on the photoresist pattern (S190).

In example embodiments, the photoresist pattern formed by the developing process may be heated by the bake process. The photoresist pattern may be heated to a third temperature. The bake process of heating to the third temperature may include a post dry develop bake (PDDB) process and a hard bake process. The post dry develop bake process and the hard bake process may be performed in the same heating chamber as the soft bake process.

The post dry develop bake process and the hard bake process may improve adhesion between the substrate and the photoresist pattern. The post dry develop bake process may amplify a difference in solubility between the photoresist pattern and the unnecessary region.

The hard bake process may improve durability and etch resistance of the photoresist pattern. The hard bake process may stabilize a resist of the photoresist pattern. The hard bake process may remove residual solvent in the photoresist pattern. For example, the third temperature may be within a range of 110 degrees to 130 degrees Celsius.

The post dry develop bake process and the hard bake process may be performed in the heating chamber. The heating chamber may be equally used in the bake process performed before and after the exposure process and the developing process, respectively.

In example embodiments, a cleaning process that cleans a rear surface or an edge area of the substrate W may be performed in the cleaning chamber. Foreign substances that are generated during the process may be removed by the cleaning process.

The cleaning process may non-selectively etch the photoresist film or the photoresist pattern to uniformly remove a film that has various levels of oxidation or the cross link on the rear surface or the edge region. For example, the cleaning process may include an edge bead removal (EBR) process.

The edge beads of the photoresist film on the edge area of the substrate W may be removed through a cleaning apparatus 400. The edge beads of the photoresist pattern on the edge area of the substrate W may be removed through the cleaning apparatus 400.

A first edge bead of the photoresist film and a second edge bead of the photoresist pattern may be removed in the same cleaning chamber. The first edge bead of the photoresist film before the exposure process is performed may be removed through the cleaning chamber, and the second edge bead of the photoresist pattern after the developing process is performed may be removed.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A substrate processing system, comprising:
  a coating apparatus configured to coat a photoresist film on a semiconductor substrate;
  an exposure apparatus configured to irradiate light onto the photoresist film to form a photoresist pattern region;
  a developing system configured to remove an unnecessary region from the photoresist film except for the photoresist pattern region to form a photoresist pattern, the developing system including a wet developing apparatus and a dry developing apparatus adjacent one another, the wet developing apparatus configured to remove the unnecessary region using a developing solution, the dry developing apparatus configured to remove the unnecessary region using a developing gas;
  a cleaning apparatus including a cleaning chamber and configured to remove an edge bead of the photoresist film or the photoresist pattern on an edge region of the semiconductor substrate; and
  a heating apparatus configured to heat the photoresist film or the photoresist pattern,
  wherein the developing system is configured to select at least one of the wet developing apparatus and the dry developing apparatus according to a type of the semiconductor substrate as a developing apparatus to form the photoresist pattern.

2. The substrate processing system of claim 1, further comprising:
  a transfer device configured to transfer the semiconductor substrate among the coating apparatus, the exposure apparatus, the developing system, the cleaning apparatus, and the heating apparatus.

3. The substrate processing system of claim 1, further comprising:
  a development inspection system configured to inspect a quality of the photoresist pattern formed on the semiconductor substrate.

4. The substrate processing system of claim 1, wherein the developing gas includes at least one selected from hydrogen ($H_2$), chlorine ($Cl_2$), fluorine ($F_2$), bromine ($Br_2$), iodine ($I_2$), hydrogen chloride (HCl), hydrogen fluoride (HF), hydrogen bromide (HBr), and hydrogen iodide (HI).

5. The substrate processing system of claim 1, wherein the cleaning apparatus is configured to remove a first edge bead of the photoresist film and a second edge bead of the photoresist pattern in the same cleaning chamber.

6. The substrate processing system of claim 1, wherein the cleaning apparatus is configured to clean the semiconductor substrate using a cleaning gas in the cleaning chamber.

7. The substrate processing system of claim 6, wherein the cleaning gas includes at least one selected from hydrogen bromide (HBr), hydrogen chloride (HCl), boron trichloride ($BCl_3$), thionyl chloride ($SOCl_2$), chlorine ($Cl_2$), boron tribromide ($BBr_3$), hydrogen ($H_2$), oxygen ($O_2$), phosphorus trichloride ($PCl_3$), methane ($CH_4$), methanol ($CH_3OH$), ammonia ($NH_3$), formic acid ($CH_2O_2$), nitrogen trifluoride ($NF_3$), and hydrogen fluoride (HF).

8. The substrate processing system of claim 1, wherein the heating apparatus is configured to heat the photoresist film provided on the semiconductor substrate to a first temperature,
  the heating apparatus is configured to heat the photoresist pattern region provided on the semiconductor substrate to a second temperature different from the first temperature, the heating apparatus is configured to heat the photoresist pattern provided on the semiconductor substrate to a third temperature different from the first and second temperatures.

9. The substrate processing system of claim 1, wherein the heating apparatus is configured to heat the photoresist film and the photoresist pattern in a same heating chamber.

10. A substrate processing system, comprising:
track equipment configured to apply photoresist film on a semiconductor substrate, the track equipment configured to form a photoresist pattern from the photoresist film; and
an exposure apparatus configured to irradiate light onto the photoresist film to form a photoresist pattern region, the track equipment comprising:
a coating apparatus configured to coat the photoresist film on the semiconductor substrate;
a developing system configured to remove an unnecessary region from the photoresist film except for the photoresist pattern region to form a photoresist pattern, the developing system including a wet developing apparatus and a dry developing apparatus adjacent one another, the wet developing apparatus configured to remove the unnecessary region using a developing solution, the dry developing apparatus configured to remove the unnecessary region using a developing gas;
a cleaning apparatus including a cleaning chamber and configured to remove an edge bead of the photoresist film or the photoresist pattern on an edge region of the semiconductor substrate; and
a heating apparatus configured to heat the photoresist film or the photoresist pattern,
wherein the developing system is configured to select at least one of the wet developing apparatus and the dry developing apparatus according to a type of the semiconductor substrate as a developing apparatus to form the photoresist pattern.

11. The substrate processing system of claim 10, wherein the track equipment further comprises a transfer device configured to transfer the semiconductor substrate among the coating apparatus, the developing system, the cleaning apparatus, and the heating apparatus.

12. The substrate processing system of claim 10, wherein the track equipment further comprises a development inspection system configured to inspect a quality of the photoresist pattern formed on the semiconductor substrate.

13. The substrate processing system of claim 10, wherein the developing gas includes at least one selected from hydrogen ($H_2$), chlorine ($Cl_2$), fluorine ($F_2$), bromine ($Br_2$), iodine ($I_2$), hydrogen chloride (HCl), hydrogen fluoride (HF), hydrogen bromide (HBr), and hydrogen iodide (HI).

14. The substrate processing system of claim 10, wherein the cleaning apparatus is configured to remove a first edge bead of the photoresist film and a second edge bead of the photoresist pattern in the same cleaning chamber.

15. The substrate processing system of claim 10, wherein the cleaning apparatus is configured to clean the semiconductor substrate through a cleaning gas in the cleaning chamber.

16. The substrate processing system of claim 15, wherein the cleaning gas includes at least one selected from hydrogen bromide (HBr), hydrogen chloride (HCl), boron trichloride ($BCl_3$), thionyl chloride ($SOCl_2$), chlorine ($Cl_2$), boron tribromide ($BBr_3$), hydrogen ($H_2$), oxygen ($O_2$), phosphorus trichloride ($PCl_3$), methane ($CH_4$), methanol ($CH_3OH$), ammonia ($NH_3$), formic acid ($CH_2O_2$), nitrogen trifluoride ($NF_3$), and hydrogen fluoride (HF).

17. The substrate processing system of claim 10, wherein the heating apparatus is configured to heat the photoresist film provided on the semiconductor substrate to a first temperature,
the heating apparatus is configured to heat the photoresist pattern region provided on the semiconductor substrate to a second temperature different from the first temperature,
the heating apparatus is configured to heat the photoresist pattern provided on the semiconductor substrate to a third temperature different from the first and second temperatures.

18. A substrate processing system, comprising:
track equipment configured to apply a photoresist film on a semiconductor substrate, the track equipment configured to form a photoresist pattern from the photoresist film; and
an exposure apparatus configured to irradiate light onto the photoresist film to form a photoresist pattern region, the track equipment comprising:
a coating apparatus configured to apply the photoresist film on the semiconductor substrate;
a developing system configured to remove an unnecessary region from the photoresist film except for the photoresist pattern region to form a photoresist pattern, the developing system comprising a wet developing apparatus and an adjacent dry developing apparatus, the wet developing apparatus configured to remove the unnecessary region with a developing solution, the dry developing apparatus configured to remove the unnecessary region with a developing gas, the developing system configured to select at least one of the wet developing apparatus and the dry developing apparatus as a developing device to form the photoresist pattern;
a cleaning apparatus including a single cleaning chamber that provides a space for (i) cleaning the semiconductor substrate with a cleaning gas and (ii) removing an edge bead of the photoresist film or the photoresist pattern on an edge region of the semiconductor substrate;
a heating apparatus configured to heat the photoresist film or the photoresist pattern;
a development inspection apparatus configured to inspect a quality of the photoresist pattern formed on the semiconductor substrate; and
a transfer device configured to transfer the semiconductor substrate among the coating apparatus, the wet developing apparatus, the dry developing apparatus, the cleaning apparatus, and the heating apparatus,
wherein one of the wet developing apparatus and the dry developing apparatus shares a common deposition chamber with the coating apparatus.

19. The substrate processing system of claim 1, wherein one of the wet developing apparatus and the dry developing apparatus shares a common deposition chamber with the coating apparatus.

20. The substrate processing system of claim 10, wherein one of the wet developing apparatus and the dry developing apparatus shares a common deposition chamber with the coating apparatus.

* * * * *